United States Patent
Kozhukh et al.

(10) Patent No.: US 10,221,336 B2
(45) Date of Patent: Mar. 5, 2019

(54) AQUEOUS SILICA SLURRY COMPOSITIONS FOR USE IN SHALLOW TRENCH ISOLATION AND METHODS OF USING THEM

(71) Applicant: Rohm and Haas Electronic Materials CMP Holdings, Inc., Newark, DE (US)

(72) Inventors: Julia Kozhukh, Bear, DE (US); David Mosley, Lafayette Hill, PA (US); Naresh Kumar Penta, Newark, DE (US); Matthew Van Hanehem, Middletown, DE (US); Kancharla-Arun K. Reddy, Wilmington, DE (US)

(73) Assignee: Rohm and Hass Electronic Materials CMP Holdings, Inc., Newark, DE (US)

( * ) Notice: Subject to any disclaimer, the term of this patent is extended or adjusted under 35 U.S.C. 154(b) by 0 days.

(21) Appl. No.: 15/680,730

(22) Filed: Aug. 18, 2017

(65) Prior Publication Data

US 2018/0362805 A1 Dec. 20, 2018

Related U.S. Application Data

(63) Continuation-in-part of application No. 15/625,075, filed on Jun. 16, 2017.

(51) Int. Cl.
| | |
|---|---|
| *C09G 1/02* | (2006.01) |
| *C08K 3/36* | (2006.01) |
| *C09K 3/14* | (2006.01) |
| *H01L 21/3105* | (2006.01) |
| *G09G 1/04* | (2006.01) |
| *C09G 1/00* | (2006.01) |
| *C09G 1/06* | (2006.01) |
| *B24B 1/00* | (2006.01) |
| *C09K 13/06* | (2006.01) |
| *B24B 37/04* | (2012.01) |
| *H01L 21/321* | (2006.01) |
| *H01L 21/306* | (2006.01) |

(52) U.S. Cl.
CPC .......... *C09G 1/02* (2013.01); *B24B 1/00* (2013.01); *B24B 37/044* (2013.01); *C08K 3/36* (2013.01); *C09G 1/00* (2013.01); *C09G 1/06* (2013.01); *C09K 3/1409* (2013.01); *C09K 13/06* (2013.01); *G09G 1/04* (2013.01); *H01L 21/30625* (2013.01); *H01L 21/31053* (2013.01); *H01L 21/3212* (2013.01)

(58) Field of Classification Search
None
See application file for complete search history.

(56) References Cited

U.S. PATENT DOCUMENTS

| | | | |
|---|---|---|---|
| 6,568,996 B2 | 5/2003 | Kobayashi et al. | |
| 6,866,793 B2 | 3/2005 | Singh | |
| 7,004,819 B2 | 2/2006 | Moeggenborg et al. | |
| 7,531,105 B2 | 5/2009 | Dysard et al. | |
| 7,846,842 B2 | 12/2010 | Carter et al. | |
| 8,138,091 B2 | 3/2012 | Dysard et al. | |
| 8,529,787 B2 | 9/2013 | Higuchi et al. | |
| 8,822,340 B2 | 9/2014 | Babu et al. | |
| 9,006,383 B2 | 4/2015 | Sato et al. | |
| 9,303,188 B2 | 4/2016 | Grumbine et al. | |
| 9,631,122 B1 | 4/2017 | Dockery et al. | |
| 2002/0104269 A1 | 8/2002 | Sun et al. | |
| 2009/0081871 A1* | 3/2009 | Dysard | C09G 1/02 438/693 |
| 2009/0081927 A1 | 3/2009 | Grumbine et al. | |
| 2011/0039475 A1* | 2/2011 | Hoshi | B24B 37/044 451/28 |
| 2011/0209413 A1* | 9/2011 | Nishida | C01B 33/14 51/308 |
| 2015/0376458 A1 | 12/2015 | Grumbine et al. | |
| 2017/0009102 A1 | 1/2017 | Hoshi et al. | |

* cited by examiner

*Primary Examiner* — Jiong-Ping Lu
(74) *Attorney, Agent, or Firm* — John J. Piskorski; Andrew Merriam

(57) ABSTRACT

The present invention provides aqueous CMP polishing compositions comprising a from 0.5 to 30 wt. %, based on the total weight of the composition of a dispersion of a plurality of elongated, bent or nodular colloidal silica particles which contain a cationic nitrogen atom, and from 0.001 to 0.5 wt. %, preferably from 10 to 500 ppm, of a cationic copolymer of a diallyldimethylammonium salt, such as a diallyldimethylammonium halide, wherein the compositions have a pH of from 1 to 4.5. Preferably, the cationic copolymer of a diallyldimethylammonium salt comprises a copolymer of diallyldimethylammonium chloride (DADMAC) and sulfur dioxide. The slurry compositions demonstrate good oxide selectivity in the CMP polishing of pattern wafers having nitride and silicon patterns.

10 Claims, No Drawings

US 10,221,336 B2

AQUEOUS SILICA SLURRY COMPOSITIONS FOR USE IN SHALLOW TRENCH ISOLATION AND METHODS OF USING THEM

This application is a continuation-in-part of U.S. Ser. No. 15/625,075, filed Jun. 16, 2017, now pending.

The present invention relates to aqueous chemical mechanical planarization (CMP) polishing compositions comprising one or more dispersions of a plurality of spherical colloidal silica particles, or of elongated, bent or nodular colloidal silica particles or their mixtures which contain a cationic nitrogen atom, and a copolymer of diallyldimethylammonium salt, such as diallyldimethylammonium chloride (DADMAC) and sulfur dioxide, wherein the compositions have a pH of from 1 to 4.5.

In front-end-of-line (FEOL) semiconductor processing, shallow trench isolation (STI) is critical to the formation of gates in integrated circuit fabrication, such as prior to formation of the transistors. In STI, a dielectric such as tetraethyl orthosilicate (TEOS) or silicon dioxide is deposited in excess in openings formed in the silicon wafer, for example, a trench or isolation area which is isolated from the remainder of the integrated circuit by silicon nitride (SiN) barrier. A CMP process is then used to remove the excess dielectric, resulting in a structure in which a predetermined pattern of the dielectric is inlaid in the silicon wafer. CMP for STI requires the removal and planarization of the silicon dioxide overburden from the isolation areas, thereby resulting in a coplanar surface with the silicon dioxide-filled trenches. In STI, the silicon nitride film surfaces must be cleared of the silicon dioxide or oxide to allow subsequent removal of the nitride hard mask in downstream processing. An acceptable oxide:nitride removal rate ratio is necessary to prevent damage to the underlying Si active areas and provide an overpolish margin to ensure all pattern densities are cleared of the oxide. Further, dishing of the oxide in any trench must be avoided to prevent low threshold voltage leaks in finished gates.

Presently, users of aqueous chemical, mechanical planarization polishing (CMP polishing) compositions used with CMP polishing pads to polish substrates wish to avoid the use of ceria containing CMP polishing compositions. Ceria slurries show high selectivity for silicon dioxide over silicon nitride and avoid removal of oxide in the trench area upon exposure of silicon nitride, but are costly, have issues with removal rate (RR) and process stability, and are prone to causing defects during polishing. Silica slurry formulations offer lower cost, defect-free solutions, but, to date, have suffered from unsatisfactory oxide dishing control and inadequate oxide:nitride selectivity for use in STI applications.

U.S. Pat. No. 9,303,188 B2, to Grumbine et al. discloses a chemical mechanical polishing composition for polishing a substrate having a tungsten layer, the composition comprising a water based liquid carrier, a cationically charged colloidal silica abrasive and a polycationic amine compound in solution in the liquid carrier. The compositions may include an amine based polymer chosen from polyamines and polymers containing amine functional groups, such as diallyldimethylammonium chloride. The compositions do not exhibit acceptable oxide dishing control and inadequate oxide:nitride selectivity for use in STI applications.

The present inventors have endeavored to solve the problem of providing aqueous silica slurries which enable acceptable oxide dishing control and oxide:nitride selectivity for use in STI applications, as well as methods for using the slurries.

STATEMENT OF THE INVENTION

1. In accordance with the present invention, aqueous chemical mechanical planarization polishing (CMP polishing) compositions comprise a dispersion of a plurality of elongated, bent or nodular colloidal silica particles which contain a cationic nitrogen atom, for example, those having for the average particle an aspect ratio of the longest dimension of the particle to its diameter which is perpendicular to the longest dimension of from 1.8:1 to 3:1, or a mixture thereof with spherical colloidal silica particles, and from 0.001 to 0.5 wt. % or, preferably, from 10 to 500 ppm of a cationic copolymer of a diallyldimethylammonium salt, preferably, a halide salt, such as a copolymer of diallyldimethylammonium halide (DADMAC) and sulfur dioxide, wherein the compositions have a pH of from 1 to 4.5 or, preferably, from 2.5 to 4.3, and, further wherein, the amount of the dispersion of the elongated, bent or nodular colloidal silica particles, ranges from 0.5 to 30 wt. %, or, preferably, from 1 to 25 wt. %, or, more preferably, from 1 to 20 wt. %, as solids, based on the total weight of the composition.

2. In accordance with the aqueous CMP polishing compositions as set forth in item 1, above, wherein the amount of the dispersion of the elongated, bent or nodular colloidal silica particles ranges from 80 to 99.9 wt. %, or, preferably, from 95 to 99.9 wt. %, based on the total solids weight of the colloidal silica particles in the compositions.

3. In accordance with the aqueous CMP polishing compositions as set forth in any one of items 1 or 2, above, wherein the weight average particle sizes (CPS) of the colloidal silica particles in the dispersion of colloidal silica particles or a weighted average of such particle sizes in the mixture thereof ranges from 10 nm to 200 nm, or, preferably, from 25 nm to 80 nm.

4. In accordance with the aqueous CMP polishing compositions as set forth in any one of items 1, 2 or 3, above, wherein the cationic copolymer of the diallyldimethylammonium salt, preferably, a halide salt, and sulfur dioxide comprises a copolymer of 45 to 55 mole % or, preferably, from 48 to 52 mole % of the diallyldimethylammonium salt and from 45 to 55 mole % or, preferably, from 48 to 52 mole % of the sulfur dioxide.

5. In accordance with the aqueous CMP polishing compositions as set forth in any one of items 1, 2, 3, or 4, above, wherein the cationic copolymer of the diallyldimethylammonium salt, preferably, a halide salt, and sulfur dioxide has a weight average molecular a weight of from 1,000 to 15,000 or, preferably, from 2,000 to 12,000.

6. In accordance with another aspect of the present invention, methods of using the aqueous CMP polishing compositions comprise polishing a substrate with a CMP polishing pad and an aqueous CMP polishing composition as set forth in any one of items 1 to 5, above.

7. In accordance with the methods of the present invention as set forth in item 6, above, wherein the substrate comprises both silicon dioxide or tetraethyl orthosilicate (TEOS) and silicon nitrides, as SiN or $Si_3N_4$ or their mixtures, and the polishing results in an oxide:nitride removal rate ratio of at least 3:1, for example, from 3:1 to 25:1 or, preferably, from 8:1 to 18:1, for example, at least 8:1.

8. In accordance with the methods of the present invention for polishing a substrate as in any one of items 6 or 7, above, wherein the polishing downforce ranges from 6.9 kPa (1 psi) to 41.5 kPa (6 psi) or, preferably, from 12 kPa (1.8 psi) to 36 kPa (5.2 psi).

9. In accordance with the methods of the present invention for polishing a substrate as in any one of items 6, 7 or 8, above, wherein the CMP polishing composition comprises a total of from 0.5 to 5 wt. %, or, preferably, from 1 to 3 wt. %, total solids content of the dispersion of the elongated, bent or nodular colloidal silica particles. The CMP polishing compositions may be stored and shipped as a concentrate and then diluted with water at the time of polishing the substrate.

Unless otherwise indicated, conditions of temperature and pressure are ambient temperature and standard pressure. All ranges recited are inclusive and combinable.

Unless otherwise indicated, any term containing parentheses refers, alternatively, to the whole term as if no parentheses were present and the term without them, and combinations of each alternative.

All ranges are inclusive and combinable. For example, the term "a range of 50 to 3000 cPs, or 100 or more cPs" would include each of 50 to 100 cPs, 50 to 3000 cPs and 100 to 3000 cPs.

As used herein, the term "ASTM" refers to publications of ASTM International, West Conshohocken, Pa.

As used herein, the term "colloidally stable" means that a given composition does not gel or precipitate, and remains clear upon visible inspection after a given time and at a given temperature.

As used herein, the term "hard base" refers to metal hydroxides, including alkali(ne earth) metal hydroxides, such as NaOH, KOH, or Ca(OH)$_2$.

As used herein, the term "ISO" refers to publications of the International Organization for Standardization, Geneva, CH.

As used herein, the term "Particle size (CPS)" means the weight average particle size of a composition as determined by a CPS Instruments (The Netherlands) disc centrifuge system. The particles are separated by size using centrifugal forces in a solvent and quantified using optical light scattering.

As used herein, the term "Shore D hardness" is the 2 second hardness of a given material as measured according to ASTM D2240-15 (2015), "Standard Test Method for Rubber Property, Durometer Hardness". Hardness was measured on a Rex Hybrid hardness tester (Rex Gauge Company, Inc., Buffalo Grove, Ill.), equipped with a D probe. Six samples were stacked and shuffled for each hardness measurement; and each pad tested was conditioned by placing it in 50 percent relative humidity for five days at 23° C. before testing and using methodology outlined in ASTM D2240-15 (2015) to improve the repeatability of the hardness tests. In the present invention, the Shore D hardness of the polyurethane reaction product of the polishing layer or pad includes the Shore D hardness of that reaction product.

As used herein, the term "silica particle solids" or "silica solids" means, for a given composition, the total amount of spherical colloidal silica particles, plus the total amount of elongated, bent or nodular colloidal silica particles, including anything with which any of those particles are treated.

As used herein, the term "solids" means any material other than water or ammonia that does not volatilize in use conditions, no matter what its physical state. Thus, liquid silanes or additives that do not volatilize in use conditions are considered "solids".

As used herein, the term "strong acid" refers to protic acids having a pK$_a$ of 2 or less, such as inorganic acids like sulfuric or nitric acid.

As used herein, the term "use conditions" means the temperature and pressure at which a given composition is used, including increases in temperature and pressure during or as a result of use.

As used herein, the term "weight fraction silica" means the total wt. % of silica, based on the total weight of the composition/100%. Thus, 30 wt. % silica equates to a weight fraction of 0.3.

As used herein, the term "weighted average" means the average of two or more measures (e.g. average particle size or molecular weight) from different compositions (e.g. a dispersion of spherical colloidal silica particles and a dispersion of elongated colloidal silica particles) resulting from multiplying each by its solids weight fraction wherein the total solids weight fraction adds up to unity (1.00).

As used herein, the term "wt. %" stands for weight percent.

As used herein, the term "elongated, bent or nodular colloidal silica particles" refers to colloidal silica particles having, in the average particle, an aspect ratio of longest dimension to the diameter which is perpendicular to the longest dimension of from 1.8:1 to 3:1 as determined by any methods known to the ordinary skilled artisan, such as transmission electron microscopy (TEM) or as reported by a manufacturer of the dispersion of particles.

The present inventors have surprisingly found that an aqueous CMP polishing composition of a dispersion of elongated, bent or nodular colloidal silica particles having a cationic charge and up to 0.5 wt. %, based on the total weight of the composition, of a cationic interpolymer of a diallyldimethylammonium salt, such as a halide or ammonium salt, and sulfur dioxide is particularly well-suited for planarizing or polishing a substrate, such as a silicon wafer that has undergone shallow trench isolation (STI) processing. Pressure response characterizations on blanket silicon wafers revealed that these slurries polish silicon oxide in a non-Prestonian manner: Oxide removal rate is negligible at a low down-force and increases with increasing down-force, at pressures higher than a "turn on" pressure. The x-intercept of such a non-Prestonian oxide RR (y axis) vs. down-force (x axis) curve is non-zero. The aqueous CMP polishing compositions of the present invention enable the CMP polishing of silicon dioxide with a satisfactory removal rate, and provide acceptable selectivity for silicon oxides over silicon nitrides both on blanket and pattern wafers. Most significantly, the compositions enable improved trench oxide loss and dishing over time compared to other silica slurries.

In accordance with the present invention, suitable colloidal silica compositions may comprise a dispersion of silica made by conventional sol gel polymerization or by the suspension polymerization of water glass so as to produce a plurality of elongated, bent or nodular colloidal silica particles in a distribution or mixture that may include spherical colloidal silica particles.

Suitable dispersions of elongated, bent or nodular colloidal silica particles are made from suspension polymerization by hydrolytic condensation of silanols formed in a known manner from precursors like tetraethoxysilane (TEOS) or tetramethoxysilane (TMOS). Processes for making the elongated, bent or nodular colloidal silica particles are known and can be found, for example, U.S. Pat. No. 8,529,787 to Higuchi et al. The hydrolytic condensation comprises reacting the precursors in aqueous suspension in the presence of a basic catalyst, such as an alkylammonium hydroxides, alkoxyalkyl amines, such as ethoxypropylamine (EOPA), alkylamines or KOH, preferably, tetramethylammonium hydroxide; the hydrolytic condensation process may incorporate one or more cationic nitrogen atoms into the elongated, bent or nodular colloidal silica particles. Preferably, the elongated, bent or nodular colloidal silica particles are cationic at a pH of 4 or below.

Suitable dispersions of bent or nodular colloidal silica particles are available from Fuso Chemical Co., Ltd., Osaka, JP (Fuso) under the tradenames HL-2, HL-3, HL-4, PL-2, PL-3 or BS-2 and BS-3 slurries. The HL and BS series particles from Fuso contain one or more nitrogen atoms which impart a cationic charge at pH 4 or below.

To insure colloidal stability of the aqueous CMP polishing compositions of the present invention, the compositions have a pH ranging from 1 to 4.5 or, preferably, from 2.5 to 4. The compositions tend to lose their stability above the desired pH range.

The cationic diallyldimethylammonium salt and sulfur dioxide copolymer of the present invention aids in selectivity and in preventing dishing in polishing. Amounts of the cationic copolymer range up to 0.5 wt. %, based on the total weight of the composition. Too much of the cationic copolymer can passivate the dielectric or silica surface of the substrates.

The cationic copolymer of the present invention may be made by addition polymerization in the presence of or in the absence of an acid, such as hydrochloric acid or glycolic acid and a radical polymerization initiator, such as ammonium persulfate, in a polar solvent such as water. Such polymerization methods are detailed, for example, in U.S. Pat. No. 9,006,383 B2 to Yusuke et al.

The aqueous CMP polishing compositions of the present invention may include pH adjusters, such as inorganic acids, for example, nitric acid, or organic acids, such as citric acid.

The aqueous CMP polishing compositions of the present invention may comprise other cationic additives, such as polyamines, in amounts of up to 1 wt. %, based on total solids.

Suitable additives may also include, for example, quaternary ammonium compounds and diquaternary ammonium compounds, such as, for example, N,N,N,N',N',N'-hexabutyl-1,4-butanediammonium dihydroxide, 98 wt. % (Sachem, Austin, Tex.); and cationic aminosilanes, such as, for example, N-(2-aminoethyl)-3-aminopropyltrimethoxysilane, 98% (Gelest Inc., Morrisville, Pa.) or N,N-diethylaminomethyl)triethoxysilane, 98%, (Gelest Inc.).

Preferably, the aqueous CMP polishing compositions consist essentially of the inventive copolymer of diallyldimethyl ammonium salt and the cationic abrasive and do not include materials which would further interact with the abrasive components or the copolymer. Such compositions preferably do not include diquaternary ammonium compounds that interacts with silica; and they do not include anionic compounds and nonionic surfactants that interact with the copolymer. The aqueous CMP polishing compositions may be diluted with water or with another liquid miscible with water.

Desirably, the CMP polishing of the present invention is carried out in STI processing with the CMP polishing composition of the invention, preferably such that the silicon nitride is not substantially removed and the silicon dioxide is adequately planarized without excessive erosion or dishing of dielectric or silicon dioxide within the trenches.

In use, STI processing of a wafer substrate involves providing a silicon substrate on which is deposited a layer of silicon nitride. Following photolithography, trenches are etched onto the substrate comprising an overlying layer of silicon nitride, and an excess of dielectric, for example, silicon dioxide, is deposited thereon. The substrate is then subjected to planarization until the surface layer of silicon nitride is exposed but not substantially removed, such that the dielectric or silicon oxide remaining in the trenches is approximately level with the edges of the silicon nitride.

EXAMPLES

The Following Examples Illustrate the Various Features of the Present Invention

In the Examples that follow, unless otherwise indicated, conditions of temperature and pressure are ambient or room temperature and standard pressure.

The following materials, including those listed in Table A, below, were used in the Examples that follow:

TABLE A

| Silica and Other Abrasive Particles | | | | | | |
|---|---|---|---|---|---|---|
| Aqueous Silica Slurry | Source | pH[5] | Particle size (CPS, nm) | Morphology | Raw Materials | Concentration (wt. % solids) |
| Slurry A | Klebosol[TM, 1] 1598-B25 | 7.7 | 38 | Spherical | Na Silicate | 30 |
| Slurry B | Klebosol[TM, 1] 30H50i | 2.5 | 75 | Spherical | Na Silicate | 30 |
| Slurry C | HL-3[TM, 3] | 7.8 | 55 | Elongated, cationic[4] particle | TMOS | 20 |
| Slurry D | BS-3[TM, 3,] | 7.3 | 53 | Elongated, cationic[4] particle | TMOS | 20 |

TABLE A-continued

Silica and Other Abrasive Particles

| Aqueous Silica Slurry | Source | pH[5] | Particle size (CPS, nm) | Morphology | Raw Materials | Concentration (wt. % solids) |
|---|---|---|---|---|---|---|
| Slurry E | Ceria | (see separate listing, below) | | | | |
| Slurry F | — | (see Slurry C, above, and separate listing, below) | | | | |
| Slurry G | — | (see Slurry A and B, above and separate listing, below) | | | | |

[1] Merck KgAA, Lamotte, France;
[3] Fuso Chemical, Osaka, JP;
[4] Charge determined at pH of 3.0 and cationic particles formed with TMOS and an amine containing alkaline catalyst, such as tetramethylammonium hydroxide;
[5] pH as delivered from source.
Diquat ™ additive: N,N,N,N',N',N'-hexabutyl-1,4-butanediammonium dihydroxide, 98 wt. % (Sachem, Austin, TX);
Slurry G: A 24 wt. % solids formulation at a pH of 2.39 and containing 20 wt. % of Slurry A solids, 4 wt. % of Slurry B solids, 0.2 wt. % Diquat ™ additive and 0.112 wt. % HNO₃. At POU (6%, 4x dilution), the pH was ~pH 3.
Copolymer 1 is a 1:1 copolymer of DADMAC and sulfur dioxide, having a weight average molecular weight (MW) (GPC using polyethylene glycol standards) of 5,000 as reported by manufacturer (PAS-A-1, Nitto Boseke Co. Ltd, Fukushima, JP);
Polymer 2 is a homopolymer of DADMAC having a weight average molecular weight of (MW, GPC) of 8,500 (Nitto Boseke Co.).
Slurry E: Ceria slurry, pH 5.2, polyacrylic acid dispersant, 0.75 wt. % ceria solids undiluted, 1:3 dilution as used.
Slurry F: A 2 wt. % solids composition of Slurry C/67 ppm poly(acrylic acid) (PAA), of weight average MW 1800/citric acid/pH 3.3; and,
Slurry C is positively charged below pH 4.5.
The various colloidal silica particles used in the Examples are listed in Table A, above.
The following abbreviations were used in the Examples that follow:
POU: Point of use;
RR: Removal rate;

The following test methods were used in the Examples that follow:

pH at POU:

The pH at point of use (pH at POU) was that measured during removal rate testing after dilution of the indicated concentrate compositions with water to the indicated solids content.

Post CMP (SP2xp) Defect Counts:

Four TEOS wafers were used as defect monitor wafers for each slurry. Each defect wafer was polished for 60 s at 3 psi, 93/87 rpm and 150 ml/min slurry flow rate. After polish, wafers were scanned on a Surfscan™ SP2xp metrology tool (KLA-Tencor, Milpitas, Calif.) to obtain Post CMP defect wafer maps, followed by automatic SEM review of 100 random defects. Klarity Defect software (KLA-Tencor, Milpitas, Calif.) with a wide open channel setting (i.e. no defect size limit) was used to extract Post CMP total defect counts for each wafer. Defect counts should be as low as possible.

Post HF (Hydrofluoric Acid) Defect Counts:

After post CMP defect analysis, wafers were exposed to a 1.92 wt. % HF solution for a time sufficient to remove 200 Å of a given substrate, using an M3307-2949 Veeco™ HF cleaner (Veeco, Horsham, Pa.). Wafers were re-scanned on the Surfscan SP2xp (KLA-Tencor) to get Post HF defect wafer maps, followed by automatic SEM review of 100 random defects.

Removal Rate:

In a removal rate test, a Mirra™ (200 mm) polishing machine or "Mirra RR" (Applied Materials, Santa Clara, Calif.) polishing device with an IC1010™ or other indicated CMP polishing pad (The Dow Chemical Company, Midland, Mich. (Dow)) was used to polish an STI pattern wafer substrate having a specified feature % (which corresponds to the area of active or high areas in the wafer relative to the total area thereof) with an MIT mask (SKW-3 wafers, SKW, Inc. Santa Clara, Calif.) using the CMP polishing compositions defined in Table 1, below, at a 20.7 kPa (3 psi) down-force, slurry flow rate of 150 mL/min, a 93 rpm platen speed and an 87 rpm carrier speed. During polishing, the pad was conditioned with a Kinik™ AD3CS-211250-1FN conditioning disk (Kinik Company, Taiwan) at a 3.17 kg (7 lbf) pressure, using 100% in situ conditioning.

Multi-Step CMP Polishing—P1 (First Step) and P2 (Subsequent Steps):

CMP polishing was conducted such that, in the first step or P1 process, the overburden high density plasma oxide (HDP) film was removed. The film was polished using a VP6000™ polyurethane CMP polishing pad (Dow, Shore D (2 second) hardness: 53) and Slurry E and by applying a polishing down-force of 20.7 kPa (3 psi) and platen speed of 93 rpm. P1 polishing was stopped when complete planarization was achieved on the 50% pattern density (PD) feature on the middle die of the wafer. At this point, ~500 Å of HDP film remained on the 50% feature. On the smaller features, such as the 10% and 20% PD features, however, the HDP film was completely removed and the underlying nitride film was exposed. Features with >50% PD still had significant dielectric film over the nitride film. Before moving to P2, the patterned wafer was cleaned using SP100 cleaning chemistry (TMAH containing) on a OnTrak DSS-200 Synergy™ tool (Lam Research, Fremont, Calif.) to remove ceria particles from the wafer. P2 polishing was performed using an IC™ polyurethane polishing pad (Dow, Shore D (2 second) hardness: 70) with 1010™ groove design (Dow) and the indicated slurry composition, using a polishing down-force of 20.7 kPa (3 psi) and a platen speed of 93 rpm. For the 50% pattern density feature, the polishing endpoint was defined as the time at which the HDP was cleared and the nitride film was exposed. Trench oxide loss was monitored on the 50% pattern density feature for each step-polishing event. The HDP oxide removal on the 100% pattern density feature was also measured. Overpolish is defined as the amount of HDP film removed on the 100% feature after silicon nitride was exposed on the 50% pattern density feature. Selectivity was calculated as the ratio of silicon nitride removal rate to the ratio of HDP oxide removal rate on the 100% feature. All dielectric film thicknesses and removal rates were determined by measuring the film thickness before and after polishing using a KLA-Tencor™ FX200 metrology tool (KLA Tencor, Milpitas, Calif.) using a 49 point spiral scan with a 3 mm edge exclusion. Further polishing details are set forth in Table B, below.

TABLE B

| Polishing Parameters | |
|---|---|
| Pads | P1: VP6000 2 mm (0.080) SIV 508 mm (20"); D18AR; SG 0.8 |
| | P2: IC1010 2 mm (0.080) SIV 508 mm (20"); 1010; SG 0.8 |
| Slurry | P1: ceria Slurry E (1:3) |
| | P2: Silica STI formulations |
| Polishing Process | 20.7 kPa (3 psi), 93/87 rpm, 150 mL/min |
| Polishing Tool | Applied Materials Mirra ™ |
| Thin Film Metrology | KLA-Tencor ™ FX200, 49 point spiral scan w/3 mm edge exclusion |
| Break-in Recipe | P1: 3.17 kg (7 lbf) for 40 min |
| | P2: 3.17 kg (7 lbf) for 40 min |
| Conditioning | P1: 100% in situ at 3.17 kg (7 lbf) |
| | P2: 100% in situ at 3.17 kg (7 lbf) |
| Slurry Drop Point | ~9.53 cm (~3.75") from pad center |

Polishing was continued for the indicated time intervals or to the extent of the indicated overpolish amount. In each of Tables 3, 4, and 5, below, Performance Criterion A is trench oxide loss (Å): Acceptable trench oxide loss is less than 250 Å at a 500 Å overpolish amount, preferably, less than 215 Å at 500 Å overpolish amount; Performance Criterion B is SiN loss (Å): Acceptable SiN loss is less than 200 Å at a 500 Å overpolish amount, preferably, less than 150 Å at a 500 Å overpolish amount; and Performance Criterion A is dishing (Å): Acceptable dishing is less than 200 Å at 500 Å overpolish amount, preferably, less than 175 Å at 500 Å overpolish amount.

Where otherwise indicated, the polished substrate was a recycled tetraethoxylsilicate (TEOS) wafer (TENR) used for blanket wafer studies.

TABLE 1

| Slurry Formulation Details | | | |
|---|---|---|---|
| Slurry | Slurry/Amount (wt. % solids) | Copolymer 1 (ppm) | pH (adjusted with HNO₃) |
| 1 | C/1 | 10 | 3.3 |
| 2 | C/3 | 20 | 3.3 |
| 3 | D/4.5 | 20 | 3.3 |
| 4* (Slurry F) | C/2 | (none) 67 ppm PAA | 3.3 |
| 5 | C/3 (with 75 ppm Diquat) | 20 | 3.3 |
| 6* | C/3 | 20 of Polymer 2 | 3.3 |

*Denotes Comparative Example.

Example 1—Defect Counts

In Table 2, below, the substrate was an oxide wafer from tetraethyl orthosilicate (TEOS). Polishing was conducted for 60 seconds using the indicated slurry.

TABLE 2

| Defect Counts | | | | |
|---|---|---|---|---|
| | | Example | | |
| | | 1A | 1B | 1C |
| | | Slurry | | |
| | | 2 | 4* | Slurry E* |
| Post CMP SP2xp Defect Counts | Wafer 1 | 241 | 245 | 22831 |
| | Wafer 2 | 119 | 496 | 23637 |
| | Wafer 3 | 207 | 124 | 26888 |
| | Wafer 4 | 139 | 136 | 21826 |
| | Average | 177 | 250 | 23796 |
| | Std. Dev. | 57 | 173 | 2191 |
| Post HF Defect Counts | Wafer 1 | 1354 | 966 | 911 |
| | Wafer 2 | 1447 | 1126 | 846 |
| | Wafer 3 | 1361 | 938 | 647 |
| | Wafer 4 | 1049 | 1061 | 442 |
| | Average | 1303 | 1023 | 712 |
| | Std. Dev. | 174 | 87 | 212 |

*Denotes Comparative Example.

As shown in Table 2, above, the defect counts after CMP polishing dropped dramatically compared to defect counts of the same wafer polished in the same manner with a ceria slurry (Slurry E) or Slurry 4 which lacks the cationic copolymer of the present invention.

Example 2—Performance in Polishing a Pattern Wafer

In Table 3, below, the substrate was an STI Wafer having a 50% PD feature. Polishing was conducted in multiple steps using the indicated slurry.

TABLE 3

| Polishing With The Cationic Copolymer and Without | | | | | | | | | |
|---|---|---|---|---|---|---|---|---|---|
| | | Example | | | | | | | |
| | | 2A* | | | 2B | | | 2C | |
| | | Slurry | | | | | | | |
| | | Slurry C (1 wt. % solids) | | | 1 | | | 2 | |
| Performance Parameter | | A | B | C | A | B | C | A | B | C |
| Oxide Overpolish Amount, Å | 121 | | | | | | | | |
| | 125 | | | | | | | | |
| | 214 | | | | | | | | |
| | 263 | | | | | | | | |
| | 270 | | | | | | | | |

TABLE 3-continued

Polishing With The Cationic Copolymer and Without

| | 2A* | | | 2B | | | 2C | | |
|---|---|---|---|---|---|---|---|---|---|
| | | | | Slurry | | | | | |
| | Slurry C (1 wt. % solids) | | | 1 | | | 2 | | |
| Performance Parameter | A | B | C | A | B | C | A | B | C |
| 302 | 171 | 51 | 121 | | | | | | |
| 372 | | | | | | | | | |
| 380 | | | | | | | | | |
| 492 | | | | 154 | 107 | 46 | | | |
| 522 | | | | | | | 201 | 55 | 146 |
| 530 | 303 | 95 | 208 | | | | | | |
| 605 | | | | | | | | | |
| 663 | | | | 209 | 150 | 59 | | | |
| 672 | | | | | | | | | |
| 701 | | | | | | | 246 | 74 | 175 |
| 804 | 446 | 147 | 299 | | | | | | |
| 816 | | | | 276 | 184 | 92 | | | |
| 832 | | | | | | | | | |
| 870 | | | | | | | 272 | 75 | 232 |
| 1071 | 609 | 208 | 401 | | | | | | |

As shown in Table 3, above, the trench oxide loss A, SiN loss B and dishing C of the inventive slurry compositions is dramatically improved over time versus just elongated cationic silica Slurry C in Comparative Example 2A.

Example 3—More Performance on a Feature Wafer

In Table 4, below, the substrate was an STI Wafer having a 50% PD feature. Polishing was conducted in multiple steps using the indicated slurry.

TABLE 4

Polishing With The Cationic Copolymer

| | | 3A | | | 3B | | |
|---|---|---|---|---|---|---|---|
| | | | | Slurry | | | |
| | | 5 | | | 3 | | |
| Performance Parameter | | A | B | C | A | B | C |
| Oxide | 121 | | | | | | |
| Overpolish | 125 | 26 | 12 | 14 | | | |
| Amount, Å | 214 | | | | 78 | 51 | 27 |
| | 263 | | | | | | |
| | 270 | | | | | | |
| | 302 | | | | | | |
| | 372 | 154 | 97 | 57 | | | |
| | 380 | | | | | | |
| | 492 | | | | 110 | 109 | 1 |
| | 522 | | | | | | |
| | 530 | | | | 139 | 153 | −14 |
| | 605 | 252 | 164 | 88 | | | |
| | 663 | | | | | | |
| | 672 | | | | 205 | 213 | −7 |
| | 701 | | | | | | |
| | 804 | | | | | | |
| | 816 | | | | | | |
| | 832 | 382 | 249 | 132 | | | |
| | 870 | | | | | | |
| | 1071 | | | | | | |

* Denotes Comparative Example.

As shown in Table 4, above, at a slight overpolish, the trench oxide loss A, SiN loss B and dishing C of the inventive slurry compositions are acceptable.

Example 4—Polishing With Various Pads

In Table 5, below, the slurry 2 was used to polish with two different pads. The substrate was an STI Wafer having a 50% PD feature. Polishing was conducted in multiple steps using the indicated slurry.

TABLE 5

Polishing with Various CMP Polishing Pads

| | | 4A | | | 4B | | |
|---|---|---|---|---|---|---|---|
| | | | | Slurry | | | |
| | | 2 | | | 2 | | |
| | | | | Pad | | | |
| | | IC1010 ™ pad | | | VP6000/K7-R32 pad | | |
| Performance Parameter | | A | B | C | A | B | C |
| Oxide | 263 | 123 | 36 | 68 | | | |
| Overpolish | 289 | | | | 144 | 103 | 41 |
| Amount, Å | 522 | 201 | 55 | 146 | | | |
| | 544 | | | | 287 | 209 | 79 |
| | 701 | 246 | 74 | 175 | | | |
| | 788 | | | | 409 | 299 | 110 |
| | 870 | 272 | 75 | 232 | | | |
| | 1009 | | | | 566 | 412 | 155 |

As shown in Table 5, above, at a slight overpolish, the trench oxide loss A, SiN loss B and dishing C of the inventive slurry composition 2 are all acceptable with an IC1010™ pad (Dow); with a slightly softer pad in Example 4B, dishing C is improved.

Comparative Example 5: Polishing as in Examples 2, 3 and 4 was Performed, Except Using a DADMAC Homopolymer Additive (Polymer 2)

TABLE 6

Comparative Polymer 2 Performance

| Slurry | Performance | Oxide Overpolish Amount, Å | | | | |
|---|---|---|---|---|---|---|
| | | 344 | 637 | 947 | 1282 | 1604 |
| 6* | Trench Oxide Loss, Å | 215 | 386 | 542 | 696 | 879 |
| | SiN Loss, Å | 39 | 81 | 122 | 176 | 251 |
| | Dishing, Å | 176 | 304 | 420 | 520 | 628 |

*Denotes Comparative Example

As shown in Table 6, above, the homopolymer of DADMAC fails to provide anywhere near the polishing performance of the compositions of the present invention having a DADMAC copolymer. Compare results with those in Tables 2, 3 and 4, above.

We claim:

1. An aqueous chemical mechanical planarization polishing composition consisting of water, a dispersion of a plurality of elongated, bent or nodular colloidal silica particles which contain a cationic nitrogen atom, an acid selected from the group consisting of sulfuric acid and nitric acid, and from 10 to 500 ppm of a cationic copolymer of a diallyldimethylammonium salt consisting of a copolymer of a diallyldimethylammonium halide salt and sulfur dioxide, wherein the composition has a pH of from 1 to 4.5 and, further wherein, the amount of the dispersion of the elongated, bent or nodular colloidal silica particles, ranges from 0.5 to 30 wt. %, all weights based on the total weight of the composition.

2. The aqueous chemical mechanical planarization polishing composition as claimed in claim 1, wherein the dispersion of elongated, bent or nodular colloidal silica particles have for the average particle an aspect ratio of longest dimension to the diameter which is perpendicular to the longest dimension from 1.8:1 to 3:1.

3. The aqueous chemical mechanical planarization polishing composition as claimed in claim 1, wherein the amount of the dispersion of elongated, bent or nodular colloidal silica particles ranges from 80 to 99.9 wt. %, based on the total solids weight of the colloidal silica particles in the composition.

4. The aqueous chemical mechanical planarization polishing composition as claimed in claim 1, wherein the cationic copolymer of a diallyldimethylammonium salt consists of a copolymer of diallyldimethylammonium chloride and sulfur dioxide.

5. The aqueous chemical mechanical planarization polishing composition as claimed in claim 4, wherein the cationic copolymer of a diallyldimethylammonium salt consisting of a copolymer of diallyldimethylammonium halide and sulfur dioxide has a weight average molecular weight of from 1,000 to 15,000.

6. The aqueous chemical mechanical planarization polishing composition as claimed in claim 4, wherein the cationic copolymer of a diallyldimethylammonium salt consists of a copolymer of diallyldimethylammonium chloride and sulfur dioxide in amounts of 10-20 ppm.

7. The aqueous chemical mechanical planarization polishing composition as claimed in claim 1, wherein the cationic copolymer of a diallyldimethylammonium salt consists of a copolymer of 45 to 55 mole % of the diallyldimethylammonium halide salt and from 45 to 55 mole % of the sulfur dioxide.

8. The aqueous chemical mechanical planarization polishing composition as claimed in claim 1, wherein the composition has a pH of from 2.5 to 4.3.

9. A method of using the aqueous chemical mechanical planarization polishing composition as claimed in claim 1, comprising: polishing a substrate with a chemical mechanical polishing pad and the aqueous chemical mechanical polishing composition.

10. The method as claimed in claim 9, wherein the substrate comprises both silicon dioxide and silicon nitrides, and the polishing results in an oxide:nitride removal rate ratio of from 3:1 to 25:1.

* * * * *